United States Patent [19]
Koke

[11] Patent Number: 5,546,029
[45] Date of Patent: Aug. 13, 1996

[54] OUTPUT DRIVER CIRCUIT HAVING REDUCED ELECTROMAGNETIC INTERFERENCE

[75] Inventor: Andreas Koke, Hamburg, Germany

[73] Assignee: U.S. Philips Corporation, New York, N.Y.

[21] Appl. No.: 372,529

[22] Filed: Jan. 13, 1995

[30] Foreign Application Priority Data

Jan. 14, 1994 [DE] Germany ............... 44 00 872.4

[51] Int. Cl.⁶ .................................................. H03K 3/00
[52] U.S. Cl. .................... 327/108; 327/112; 327/374; 327/437
[58] Field of Search ............... 327/108, 109, 327/111, 112, 374, 375, 376, 377, 437, 551

[56] References Cited

U.S. PATENT DOCUMENTS 4,622,482 11/1986 Ganger .................................. 327/410

FOREIGN PATENT DOCUMENTS

| | | |
|---|---|---|
| 0250036A1 | 12/1987 | European Pat. Off. ....... H03K 19/00 |
| 0368524 | 5/1990 | European Pat. Off. . |
| 0379881 | 8/1990 | European Pat. Off. . |
| 4206864 | 1/1993 | Germany . |
| 2309810 | 12/1989 | Japan ............................ H03K 17/16 |
| 2309809 | 12/1990 | Japan ............................ H03K 17/16 |

Primary Examiner—Timothy P. Callahan
Assistant Examiner—Kenneth B. Wells
Attorney, Agent, or Firm—Steven R. Biren

[57] ABSTRACT

An output driver circuit for preventing the emission of high-frequency signals, including two MOS output transistors (M2, M1) which are connected in series between the supply voltage (Vcc) and ground, and two capacitors (C1, C2) which are arranged between the output node (N1) and the gate of a respective output transistor. The voltages on the gates of the output transistors are quickly increased to the conductivity threshold before a transition occurs on the output, whereby acceleration circuits supply the gates of the output transistors with high currents. During the transition of the output signal, the acceleration circuits are switched off and smaller currents are applied to the gates of the output transistors; the capacitances (C1, C2), being connected in phase opposition, prevent excessively fast variation of the voltage on the output node.

9 Claims, 2 Drawing Sheets

5,546,029

OUTPUT DRIVER CIRCUIT HAVING REDUCED ELECTROMAGNETIC INTERFERENCE

BACKGROUND OF THE INVENTION

The invention relates to an output driver circuit in which the generation of electromagnetic interference at high switching speeds is substantially reduced. The circuit comprises two capacitors which are connected in negative feedback between the output node and the gates of the output transistors, with the result that the edge steepness of the output signal is reduced. From the prior art various solutions are known to solve the problems encountered in output circuits in the case of high switching speeds.

EP-A 0 368 524 describes an output driver circuit in which capacitors are also connected between the output and the gates of the output transistors in order to reduce the switching speed of the output transistors, and hence to reduce the voltage peak in the supply voltage and in the ground lead.

EP-A-0 379 881 describes an output driver circuit in which a single capacitor is connected between the output node and the gate of a lower output transistor in order to impart a specific shape to the voltage on the gate of this output transistor.

In the former document, the capacitors serve to reduce the steepness of the output signal transitions in conjunction with the two resistors and the inverter inserted in the path of the input signal. These steps lead to an unacceptable delay and, moreover, the output signal edges cannot be suitably defined. The circuit disclosed in the second document also suffers from excessive delay, even though therein the output signal edges can be more accurately defined as a result of the operation of the lower transistor with an operating voltage which varies as a square root of time.

None of the prior art documents discloses the characteristics of a suitably defined, controllable edge steepness in combination with acceleration circuits for accelerating the start of the transition.

DE 42 06 864 describes an output driver circuit intended to achieve a reduced edge steepness of the output signal without using capacitors. For each output transistor in this circuit there is provided a driver circuit which comprises an inverter and a delay circuit connected to the inverter. In the event of signal transition on the input, intended to turn over the output transistor, the charge of the gate of the output transistor is quickly reversed, via the low-resistance inverter, until the output transistor starts to conduct. At that instant the inverter should be switched to the high-resistance state by the delay circuit, so that the gate of the output transistor change its level only slowly and slowly turns on the output transistor. However, this necessitates accurate adjustment of various parameters, including the delay time of the delay circuit, which adjustment is difficult to realize.

SUMMARY OF THE INVENTION

It is an object of the invention to provide a circuit which avoids the emission of undesirable high-frequency signals, without giving rise to unacceptable delays.

This object is achieved in that the voltages on the gates of the output transistors are very quickly increased to their voltage thresholds by acceleration circuits which apply a high current to the gates of the output transistors. Subsequently, these acceleration circuits are switched off in order to allow the transition of the output signal to be determined by the charging of the capacitors in that a lower current is then applied to the gates by further current sources. Because the capacitors are connected in negative feedback between the output node and the gates of the output transistors, the capacitors are charged more slowly. The accuracy with which the output signal edges can be defined is an advantage. The output transistors with the capacitors connected in negative feedback operate as Miller integrators which are known to supply an output voltage which is a linear function of time when a step function is applied to the input. The steepness of the output signal edges can be simply determined by parameters such as the capacitance of the capacitor and the value of the charging current.

DESCRIPTION OF THE PREFERRED EMBODIMENTS

Figure 1:
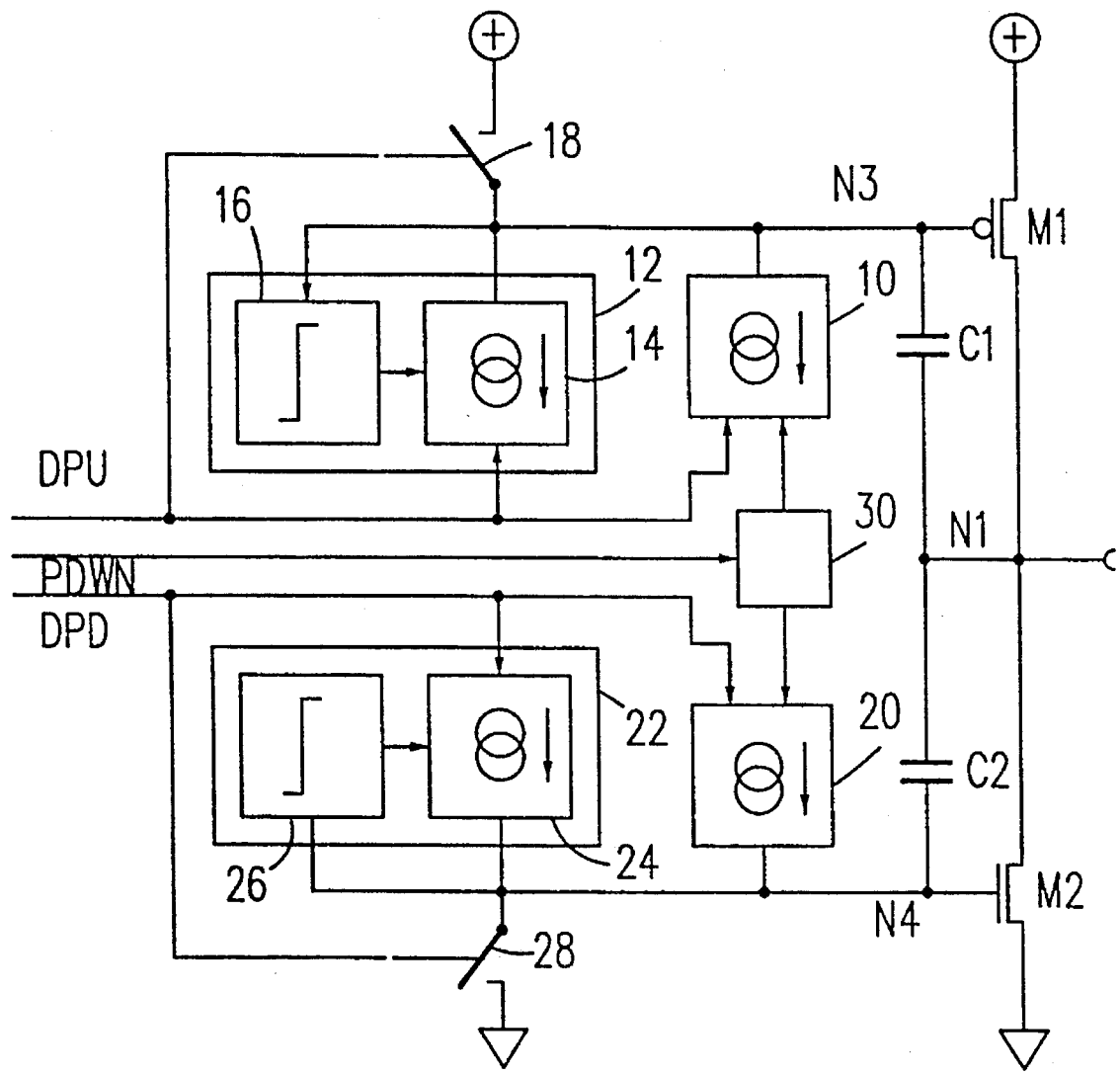
FIG. 1 shows a block diagram of an output driver circuit in accordance with the invention.

FIG. 1 shows two complementary MOS output transistors M1 and M2 which are connected in series between the positive supply voltage and ground. An output node N1 results from the junction point between the two output transistors and is connected to an output terminal. The gate of the output transistor M1 is connected to a node N3 which is also connected to a number of elements, i.e. a capacitor C1, a first current source 10, a first acceleration circuit 12, and a switch 18. Corresponding to this, the gate of the output transistor M2 is connected to a node N4 which is also connected to a capacitor C2, a second current source 20, a second acceleration circuit 22, and a further switch 28. The capacitors C1 and C2 are connected to the output node N1. Consequently,, in conjunction with the capacitor C1 the output transistor M1 constitutes a Miller integrator when a constant current is applied to the node N3. Corresponding to this, the output transistor M2 also constitutes a Miller integrator in conjunction with the capacitor C2.

The output driver circuit shown is driven via two separate inputs DPU and DPD. The further description of the function of the output driver circuit will be restricted to the first output transistor M1 and its associated elements, because the output transistor M2 and associated elements operate in a mirror-like fashion. It iS merely to be noted that the two input signals must have the same signal level.

The signal on the input DPU controls the switch 18 as well as the acceleration circuit 12 and the current source 10. When the signal on DPU is high, the switch 18 is closed so that the node N3 carries the positive supply voltage and completely turns off the output transistor M1 while the acceleration circuit 12 and the current source 10 are switched off. When the signal on DPU becomes low, the switch 18 is opened and at the same time the current source 10 and the acceleration circuit 12 are switched on. The current of the source 10 is adjusted, by way of a current control circuit 30, to a value which generates the desired output edge on the output node N1 in conjunction with the value of the capacitor C1.

The acceleration circuit 12 comprises a further current source 14 which applies a high current to the node N3. Consequently, after the transition of the signal on DPU, the node N3 very quickly becomes more negative until it reaches a value at which a threshold circuit 16 in the acceleration circuit 12 is triggered and switches off the current source 14. The threshold value of the threshold circuit 16 preferably approximately equals the threshold voltage at which the output transistor M1 is turned on. As a result, after a signal transition of the signal on DPU, the voltage of the node N3 is quickly adjusted to a value at which the output transistor M1 is turned on. Subsequently, however, only the low current from the current source 10 flows, so that the voltage on the output node N1 increases in the desired, defined manner, that is to say linearly in time, when the current source 10 supplies a constant current. This linear increase thus commences only shortly after a signal transition in the signal DPU.

The current control circuit 30 can be controlled via the input PDWN in such a manner that it switches over the current source 10, and hence the current source 20, to a large current. Consequently, a steep signal transition N1 occurs on the output node; this may be more attractive in given cases.

Figure 2:
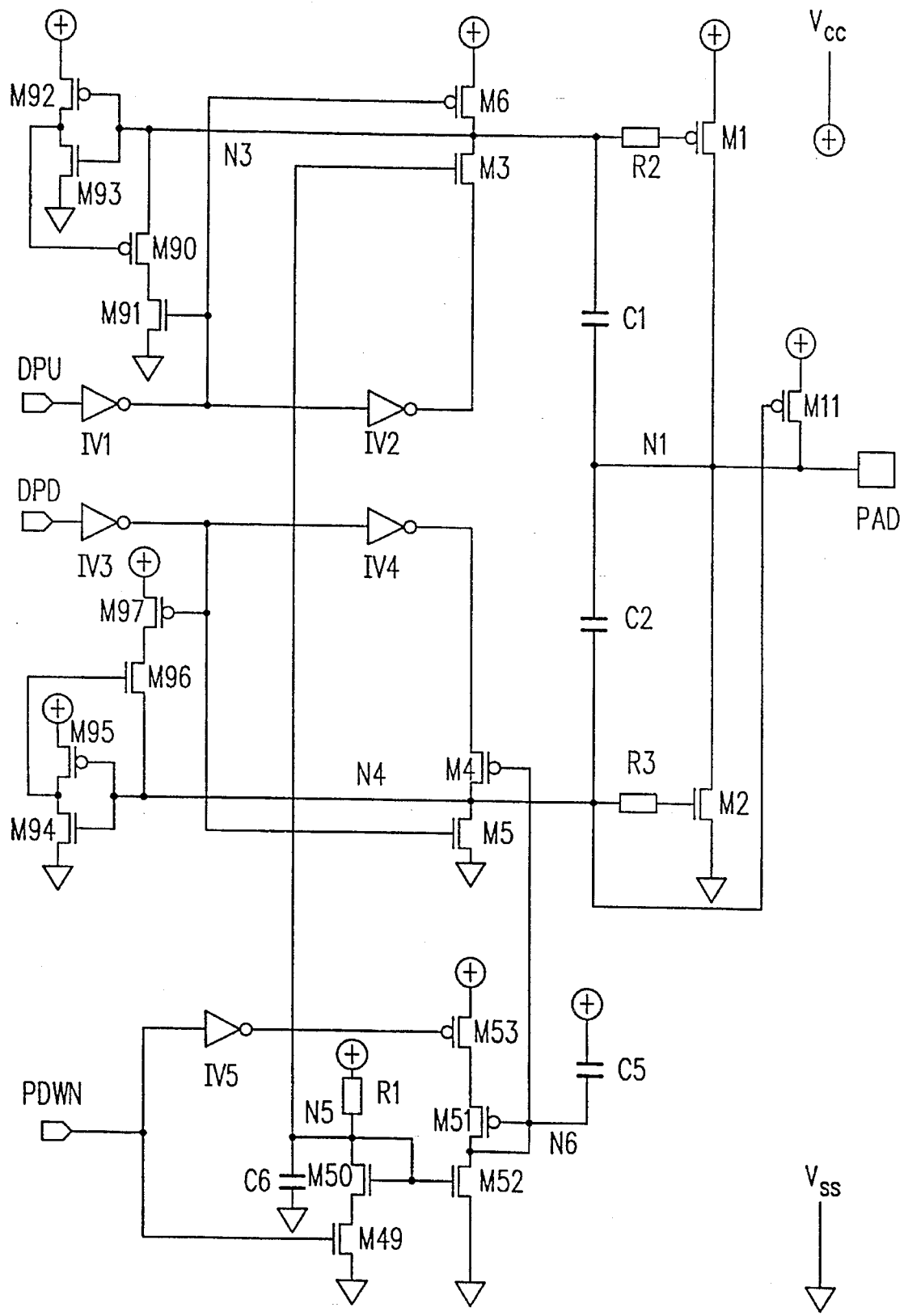
FIG. 2 shows a detailed circuit diagram.

The circuit diagram of FIG. 2 is a detailed representation of a feasible configuration of the current sources 10, 20 and the acceleration circuits 12, 22. Hereinafter, again only the upper part of the output driver circuit will be described, because the other pan of the circuit, comprising the lower output transistor, operates in a minor-like fashion.

The series connection comprising transistors M90 and M91 in the acceleration circuit is coupled to the input of the inverter M92, M93 and the gate of the upper output transistor M1 at a node N3. One of the series-connected transistors is an NMOS transistor M91 which is coupled to the lower supply voltage Vss, i.e. to ground and whose gate receives the signal on the input DPU via an inverter IV1. The second transistor of the series connection is a PMOS transistor M90 which is arranged between the transistor M91 and the node N3 and whose gate is coupled to the output of the inverter M92, M93. A further PMOS transistor M6 is arranged between the upper supply voltage and the node N3, and another NMOS transistor M3 is coupled to the node N3. A resistor R2 is inserted between the node N3 and the gate of the upper output transistor M1 in order to prevent a stray pulse on the output from causing a voltage breakdown in the gate-drain path of the output transistor M2. The capacitor C1 is arranged between the node N3 and the output node N1.

The input DPU is coupled, via an inverter IV1, to the gate of the NMOS transistor M91 and the gate of the PMOS transistor M6, and via, a further inverter IV2, to the source of the NMOS transistor M3. A mean voltage level is applied to the gate of the NMOS transistor M3 by a current mirror circuit which will be described in detail hereinafter.

In the first instance it is assumed that the signal on the input DPU is at a logic high level which is inverted by the inverter IV1, the NMOS transistor M91 then being turned off and the PMOS transistor M6 being turned on. Because the NMOS transistor M91 is turned off, no current can flow from the node N3 to ground and because the supply voltage Vcc is coupled to the node N3 via the PMOS transistor M6, the first output transistor M1 is turned off. Because the inverter IV2 applies a high voltage level to the NMOS transistor M3, no current can flow from the node N3 to ground via this path. Because the node N3 assumes a voltage equal to the upper supply voltage Vet, a low voltage level is applied to the gate of the PMOS transistor M90, via the inverter M92 M93, the PMOS transistor M90 then being turned on.

When the signal on the input DPU changes over from the high level to a low level, the output of the inverter IV1 assumes a high voltage level, the NMOS transistor M91 then being turned on whereas the PMOS transistor M6 is turned off; via the NMOS transistor M3, the inverter IV2 enables a high-resistance path to ground. Because a current flows from the node N3, the voltage on the gate of the output transistor M1 will decrease. This current is distributed between two branches: a first, high current which flows via the series connection of the two complementary transistors M90, M91, and a second current which flows to ground via the NMOS transistor M3. The first high current flows until the voltage level at the node N3 reaches the threshold voltage of the PMOS transistor M92, the output of the inverter then being switched over and the PMOS transistor M90 being turned off. In this respect it is assumed that the NMOS transistor M93 is high ohmic and also that the threshold voltage of the PMOS transistor M92 is slightly higher than that of the output transistor M1, because the voltage on its gate slightly lags the voltage of the node N3 on account of the resistor P,2 and the drain-gate capacitance of the output transistor M1. For given values of these elements the threshold voltage of the PMOS transistor M92 can be chosen so that the output signal of the inverter switches over and turns off the PMOS transistor M90 exactly at the instant at which the voltage directly on the gate of the output transistor M1 reaches the threshold voltage. The effect of the acceleration circuit thus ceases when the voltage on the gate of the output transistor M1 has been quickly increased to the threshold voltage.

The only current then flowing from the node N3 is drawn off by the NMOS transistor M3. The voltage on the output node increases slowly; at the same time the voltage on the gate of the output transistor M1 decreases. The increasing output voltage is coupled to the node N3 by the capacitor C1, an excessively fast decrease of the voltage on the gate of the first output transistor M1 thus being compensated for so as to achieve an output signal with a defined edge steepness, i.e. as a linear function of time.

The basic principle is that of the Miller integrator. When a step function is applied as an input signal to a Miller integrator, a function is obtained on the output which is linearly dependent on time. Because the edge steepness of the output signal is limited, the emission of high-frequency interference is substantially reduced.

The transistors M49 to M53 form the current mirror circuit. It comprises a first series connection which is connected between the upper supply voltage Vcc and ground and consists of a resistor R1 and two NMOS transistors M49 and M50, the resistor R1 and the source of the NMOS transistor M49 being coupled to the upper supply voltage Vcc and to ground, respectively, the NMOS transistor M50 being coupled to the resistor R1 in a first output node N5 of the current mirror circuit and to the drain of the NMOS transistor M49. The gate of the transistor M50 is connected to the node N5.

The current mirror circuit also comprises a second series connection which is connected between the upper supply voltage Vet and ground and which consists of two PMOS transistors M53 and M51 and one NMOS transistor M52, the source of the PMOS transistor M53 and the source of the NMOS transistor M52 being connected to the upper supply voltage Vet and to ground, respectively, whereas the PMOS transistor M51 is coupled to the PMOS transistor M53 and, in a second output node N6 of the current mirror circuit, to the drain of the NMOS transistor M52. The gate of the PMOS transistor M51 is connected to the node N6. The gate of the NMOS transistor M50 is connected to the gate of the transistor M52.

The nodes N5 and N6 are coupled to the gate of the NMOS transistor M3 and to the gate of the PMOS transistor M4, respectively. The current mirror circuit is controlled by the input signal PDWN which is applied directly to the gate of the NMOS transistor M49 and, via an inverter IV5, to the gate of the PMOS transistor M53.

A first current, flowing through the resistor R1 and the NMOS transistors M49, M50, is mirrored in a second current which flows through the transistors M51–M53.

When the signal on the input PDWN assumes a high logic level, the current mirror circuit is activated. The states of the transistors M3 and M4 are then controlled by the voltages arising on the nodes N5 and N6, and hence also the current derived from the nodes N3 and N4, respectively, by these transistors. Via the capacitance of the capacitors C1 and C2, the edge steepness of the output signal is thus determined. The capacitors C5, C6 serve merely to prevent fluctuations in the supply voltage Vcc and in the ground lead from the gates of the NMOS transistor M3 and the PMOS transistor M4.

When the signal on the input PDWN assumes a low logic level, the current mirror circuit is not activated, the gates of the transistors M3 and M4 then being coupled to ground and to the upper supply voltage, respectively, the transistors thus being saturated. The edge steepness of the output signal can then no longer be controlled. Power can be saved by deactivation of the current mirror circuit, which is an important aspect in the case of battery-powered applications.

The output driver circuit in accordance with the invention is also capable of operating in a tri-state mode. When the signal on the input DPU assumes a high logic level and the signal on the input DPD assumes a low logic level, both output transistors M2, M1 are turned off, a smaller, less powerful PMOS transistor M11 which is arranged between the supply voltage Vcc and the output node is then being turned on. This PMOS transistor M11 is a high-resistance type, so that an externally applied low logic signal can readily pull down the potential on the output node so that this output node can be used as an input in this state.

I claim:

1. An output driver circuit, comprising a first MOSFET output transistor (M1) which is connected between a first, upper supply voltage (Vcc) and an output node (N1), a second MOSFET output transistor (M2) which is connected between the output node (N1) and a lower supply voltage (Vss), a first capacitor (C1) which is connected between a gate of the first MOSFET output transistor (M1) and the output node (N1), a second capacitor (C2) which is connected between the output node (N1) and the gate of the second MOSFET output transistor (M2), a first current source (10) which is connected to the first capacitor (C1) and the gate of the first output transistor at a first node (N3) in order to apply a first current to the first node (N3), a second current source (20) which is connected to the second capacitor (C2) and the gate of the second MOSFET output transistor (M2) at a second node (N4) in order to apply a second current to the second node (N4), a first acceleration circuit (12) whose input and output are coupled to the first node (N3) and a second acceleration circuit (22) whose input and output are coupled to the second node (N4) in order to charge the capacitors (C1, C2), when the MOSFET output transistors (M1, M2) are turned on, with a third current, which is larger than the first current and the second current, respectively, until the turn-on threshold voltages of the MOSFET output transistors (M1, M2) are reached.

2. An output driver as claimed in claim 1, characterized in that the first current source (10) comprises a first NMOS transistor (M3) and the second current source (20) comprises a first PMOS transistor (M4), the gates of both transistors being connected to control means for providing signals to said gates for equally controlling the conductivity of both transistors.

3. An output driver circuit as claimed in claim 2, characterized in that the first acceleration circuit comprises a second PMOS transistor (M92) and a first series connection which consists of a third PMOS transistor (M90) and a second NMOS transistor (M91), the second acceleration circuit comprising a third NMOS transistor (M94) and a second series connection which consists of a fourth PMOS transistor (M97) and a fourth NMOS transistor (M96), the first series connection being connected between the first node (N3) and the lower supply voltage (Vss), the gate of the third PMOS transistor (M90) being connected to the second PMOS transistor (M92) and a first circuit input (DPU) being coupled to the gate of the second NMOS transistor (M91), the second series connection being connected between the upper supply voltage (Vcc) and the second node (N4), the gate of the fourth NMOS transistor (M96) being connected to the third NMOS transistor (M94) and a second circuit input (DPD) being coupled to the gate of the fourth PMOS transistor (M97) and in that the turn-on threshold voltages of the first output transistor (M1) and the second PMOS transistor (M92) as well as the turn-on threshold voltages of the second output transistor (M2) and the third NMOS transistor, respectively, are substantially equal.

4. An output driver circuit as claimed in claim 2, characterized in that a fifth PMOS transistor (M6) is connected between the upper supply voltage (Vcc) and the first node (N3) and a fifth NMOS transistor (M5) is connected between the second node (N4) and the lower supply voltage (Vss), the first circuit input (DPU) also being coupled to the gate of the fifth PMOS transistor (M6), the second circuit input signal (DPD) also being coupled to the gate of the fifth NMOS transistor (M5).

5. An output driver circuit as claimed in claim 2, characterized in that the first input (DPU) is coupled to the first NMOS transistor (M3) a first circuit inverter (IV2), and the second circuit input (DPD) is coupled to the first PMOS transistor (M4) a second inverter (IV4).

6. An output driver circuit as claimed in claim 2, characterized in that the conductivity of the first NMOS transistor (M3) and the first PMOS transistor (M4) is controlled by a third circuit input (PDWN).

7. An output driver circuit as claimed in claim 6, characterized in that a first output of a current mirror circuit (R1, M49-M53) is connected to the gate of the first NMOS transistor (M3) and a second output of the current mirror circuit is connected to the gate of the first PMOS transistor (M4).

8. An output driver circuit as claimed in claim 7, characterized in that when the third input signal (PDWN) is in a first logic state, the first NMOS transistor (M3) and the first PMOS transistor (M4) are saturated, and that when the third input signal (PDWN) is in a second logic state, the conductivity of the first NMOS transistor (M4) and the first PMOS transistor (M4) is determined by the current mirror circuit.

9. An output driver circuit as claimed in claim 2, characterized in that a first output of a current mirror circuit (R1, M49-M53) is connected to the gate of the first NMOS transistor (M3) and a second output of the current mirror circuit is connected to the gate of the first PMOS transistor (M4).

* * * * *